US012658872B2

(12) United States Patent
Feng et al.

(10) Patent No.: US 12,658,872 B2
(45) Date of Patent: Jun. 16, 2026

(54) FILTER, INTEGRATED PASSIVE DEVICE, ELECTRONIC DEVICE AND DISPLAY DEVICE

(71) Applicants: Beijing BOE Optoelectronics Technology Co., Ltd., Beijing (CN); BOE Technology Group Co., Ltd., Beijing (CN)

(72) Inventors: Chunnan Feng, Beijing (CN); Yulin Feng, Beijing (CN); Xue Cao, Beijing (CN); Yuelei Xiao, Beijing (CN); Can Zhang, Beijing (CN); Yifan Wu, Beijing (CN); Huiying Li, Beijing (CN); Qichang An, Beijing (CN); Yue Li, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 100 days.

(21) Appl. No.: 18/644,045

(22) Filed: Apr. 23, 2024

(65) Prior Publication Data

US 2024/0283422 A1    Aug. 22, 2024

Related U.S. Application Data

(63) Continuation of application No. PCT/CN2023/076880, filed on Feb. 17, 2023.

(51) Int. Cl.
*H03H 7/01* (2006.01)

(52) U.S. Cl.
CPC ........ *H03H 7/0115* (2013.01); *H03H 7/0161* (2013.01); *H03H 7/1775* (2013.01)

(58) Field of Classification Search
CPC ... H03H 7/0115; H03H 7/0161; H03H 7/1775
(Continued)

(56) References Cited

U.S. PATENT DOCUMENTS

| 5,300,838 A | 4/1994 | Elizondo | |
| 2015/0180437 A1* | 6/2015 | Zuo ..................... | H01F 27/2866 29/25.03 |

(Continued)

FOREIGN PATENT DOCUMENTS

| CN | 111049498 A | 4/2020 |
| CN | 113824464 A | 12/2021 |

(Continued)

*Primary Examiner* — Rakesh B Patel
(74) *Attorney, Agent, or Firm* — IPro, PLLC

(57) ABSTRACT

Embodiments of the present disclosure provide a filter, an integrated passive device, an electronic device and a display device. The filter includes: a first port, a second port, a first band-pass filter circuit, a second band-pass filter circuit and a third band-pass filter circuit. The first band-pass filter circuit is configured to output a first signal after suppressing a signal with a frequency between a first frequency and a second frequency in an initial signal input from the first port; the second band-pass filter circuit is configured to receive the first signal and output a second signal with a frequency between a third frequency and a fourth frequency in the first signal; the third band-pass filter circuit is configured to receive the second signal and output a third signal with a frequency between a fifth frequency and a sixth frequency in the second signal to the second port.

17 Claims, 11 Drawing Sheets

(58) Field of Classification Search
USPC ................................................ 333/175, 185
See application file for complete search history.

(56) References Cited

U.S. PATENT DOCUMENTS

2016/0134308  A1*    5/2016   Schmidhammer  .....   H04B 1/005
                                                        370/277
2017/0025887  A1*    1/2017   Hyun  ......................  H02J 50/90
2018/0212452  A1*    7/2018   Chou  ......................  H02J 50/12
2021/0250111  A1     8/2021   Mori

FOREIGN PATENT DOCUMENTS

CN          114679149  A      6/2022
CN          115051669  A      9/2022

* cited by examiner

1

FILTER, INTEGRATED PASSIVE DEVICE, ELECTRONIC DEVICE AND DISPLAY DEVICE

CROSS-REFERENCE TO RELATED APPLICATIONS

This application is a continuation application of International Application No. PCT/CN2023/076880, filed on Feb. 17, 2023, which is hereby incorporated by reference in its entirety.

TECHNICAL FIELD

The present disclosure relates to the field of electronic technology, and in particular to a filter, an integrated passive device, an electronic device and a display device.

BACKGROUND

As an indispensable and important component of communication systems, filters have a wide range of applications.

There are many different types of traditional filters, including LC filters, cavity filters, etc. The cavity filters are large in size and are generally used in base stations and other fields. The LC filters have a low degree of integration, a large size for common devices, and are mainly used in low-frequency areas, and have poor filtering characteristics for high-frequency signals.

SUMMARY

Some embodiments of the present disclosure provide a filter including: a first port, a second port, a first band-pass filter circuit, a second band-pass filter circuit and a third band-pass filter circuit;

where the first band-pass filter circuit is connected with the first port and is configured to output a first signal after suppressing a signal with a frequency between a first frequency and a second frequency in an initial signal input from the first port;

the second band-pass filter circuit is coupled with the first band-pass filter circuit, and is configured to receive the first signal, and output a second signal with a frequency between a third frequency and a fourth frequency in the first signal;

the third band-pass filter circuit is coupled with the second band-pass filter circuit, and is configured to receive the second signal, and output a third signal with a frequency between a fifth frequency and a sixth frequency in the second signal to the second port;

the first frequency is less than the second frequency;

the third frequency is between the first frequency and the second frequency;

the fifth frequency is between the third frequency and the second frequency.

In some embodiments, the sixth frequency is greater than the second frequency and the fourth frequency is greater than the sixth frequency.

In some embodiments, the first band-pass filter circuit includes: a first capacitor, a second capacitor, a third capacitor, a first inductor, a second inductor and a ground terminal;

a first electrode of the first capacitor is connected with the first port, and a second electrode of the first capacitor is connected with the second band-pass filter circuit;

2 a first electrode of the first inductor is connected with the first electrode of the first capacitor, and a second electrode of the first inductor is connected with the second electrode of the first capacitor;

a first electrode of the second capacitor is connected with the first electrode of the first capacitor, and a second electrode of the second capacitor is connected with a first electrode of the second inductor;

a second electrode of the second inductor is connected with the ground terminal;

a first electrode of the third capacitor is connected with the first electrode of the second inductor, and a second electrode of the third capacitor is connected with the second electrode of the second inductor.

In some embodiments, the first capacitor is a strip capacitor.

In some embodiments, the second band-pass filter circuit includes: a fourth capacitor, a fifth capacitor, a sixth capacitor, a seventh capacitor, a third inductor, a fourth inductor and a ground terminal;

a first electrode of the fourth capacitor is connected with the first band-pass filter circuit, and a second electrode of the fourth capacitor is connected with a first electrode of the fifth capacitor;

a second electrode of the fifth capacitor is connected with the third band-pass filter circuit;

a first electrode of the sixth capacitor is connected with the first electrode of the fourth capacitor, and a second electrode of the sixth capacitor is connected with the ground terminal;

a first electrode of the third inductor is connected with the first electrode of the sixth capacitor, and a second electrode of the third inductor is connected with the second electrode of the sixth capacitor;

a first electrode of the seventh capacitor is connected with the second electrode of the fifth capacitor, and a second electrode of the seventh capacitor is connected with the ground terminal;

a first electrode of the fourth inductor is connected with the first electrode of the seventh capacitor, and a second electrode of the fourth inductor is connected with the second electrode of the seventh capacitor.

In some embodiments, at least one of the fourth capacitor or the fifth capacitor is a strip capacitor.

In some embodiments, the third band-pass filter circuit includes: an eighth capacitor, a ninth capacitor, a tenth capacitor, a fifth inductor, a sixth inductor and a ground terminal;

a first electrode of the eighth capacitor is connected with the second band-pass filter circuit, and a second electrode of the eighth capacitor is connected with the second port;

a first electrode of the fifth inductor is connected with the first electrode of the eighth capacitor, and a second electrode of the fifth inductor is connected with the second electrode of the eighth capacitor;

a first electrode of the ninth capacitor is connected with the second electrode of the eighth capacitor, and a second electrode of the ninth capacitor is connected with a first electrode of the sixth inductor;

a second electrode of the sixth inductor is connected with the ground terminal;

a first electrode of the tenth capacitor is connected with the first electrode of the sixth inductor, and a second electrode of the tenth capacitor is connected with the second electrode of the sixth inductor.

In some embodiments, the eighth capacitor is a strip capacitor.

In some embodiments, a connection wire between a capacitor and an inductor in the filter is a stubby wire.

In some embodiments, capacitor values of the capacitors in the filter are same.

In some embodiments, the capacitor values of the capacitors in the filter are in a range of 0.1 to 10 pF.

In some embodiments, inductor values of the inductors in the filter are same.

In some embodiments, the inductor values of the inductors in the filter are in a range of 0.1 to 10 nH.

In some embodiments, the filter is formed on a glass substrate.

In some embodiments, the filter is a high-frequency filter.

Some embodiments of the present disclosure provide an integrated passive device, including the filter as described above.

Some embodiments of the present disclosure provide an electronic device, including the integrated passive device as described above.

Some embodiments of the present disclosure provide a display device, including the electronic device as described above.

DETAILED DESCRIPTION

Figure 1:
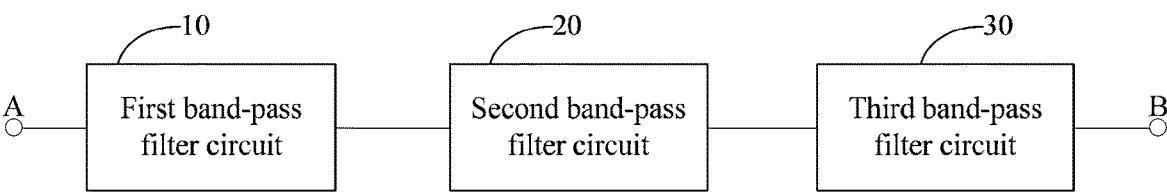
FIG. 1 is a schematic diagram of some structures of a filter according to an embodiment of the present disclosure.

In order to make the purpose, technical solution and advantages of embodiments of the present disclosure clearer, the technical solutions of embodiments of the present disclosure will be clearly and completely described below in conjunction with the accompanying drawings of embodiments of the present disclosure. Obviously, embodiments described are some embodiments of the present disclosure, not all embodiments. And in the absence of conflict, embodiments in the present disclosure and the features in embodiments may be combined with each other. Based on embodiments of the present disclosure described, all other embodiments obtained by the skilled in the art without creative labor are within the scope of protection of the present disclosure.

Unless otherwise defined, the technical or scientific terms used in the present disclosure shall have the ordinary meaning understood by the skilled in the field to which the present disclosure belongs. The terms "first", "second" and similar expressions used in the present disclosure do not indicate any order, number or importance, but only to distinguish the different components. Words such as "include" or "comprise" mean that the element or object that precedes the word includes the element or object listed after the word and its equivalents, and does not exclude other elements or objects. Similar terms such as "connect" or "connected" are not limited to physical or mechanical connections, but may include electrical connections, whether direct or indirect.

It should be noted that the size and shape of each figure in the drawings do not reflect the true proportions, and the purpose is only to illustrate the contents of the present disclosure. The same or similar designation at all times indicates the same or similar element or component with the same or similar function.

With the development of aerospace, national defense technology, satellite remote sensing and radar communication technologies, the communication technology has developed rapidly, and the performance, volume, and reliability of microwave RF devices have become increasingly stringent. In addition, due to the rapid spread of 5G technology, the use of high-speed signals in daily life and industry has also increased significantly. Therefore, the development of high-speed signal electronics has become the core of the development of communication technology.

The communication system includes many common RF structures, such as filters, baluns, duplexers, switches, etc., which are generally composed of printed circuit board (PCB) and external circuits and discrete capacitors and inductors. These devices and circuit structures occupy most of the area of the PCB structure, more than 50%, which seriously affects the development of communication system miniaturization.

As an indispensable and important component of communication systems, filters have a wide range of applications. There are many different types of traditional filters, including LC filters, cavity filters, etc. The cavity filters are large in size and are generally used in base stations and other fields. The LC filters, on the other hand, can be used in some small electronic devices by arranging different amounts of inductors, capacitors, and resistors according to the circuit design to achieve the filter function. However, the LC filter composed of traditional discrete components has a low degree of integration, and a large size for common devices, is mainly used in low-frequency areas, and has poor filtering characteristics for high-frequency signals. The technical indicators of the filter in use include passband frequency band, bandwidth, insertion loss, out-of-band suppression, etc. In the 5G era, the core goals of communication technology development are high bandwidth, low loss, and fast out-of-band attenuation.

The structure of the transmission line filter is simple in the microwave range, but the structure is frequency-dependent and tends to be relatively large. In the field of radio frequency, when the frequency is generally in GHz, the length of the device is generally half wavelength or quarter wavelength resonant unit in order to meet the use conditions, and the size of the device is greatly increased, which cannot meet the development of miniaturization. Traditional LC filters are combined using discrete components, with a low degree of integration, small Q value, and poor insertion loss, which are incompatible with the characteristics of large bandwidth, high roll-off, and high out-of-band suppression under RF. At the same time, traditional LC circuits are mainly used in the lower frequency bands, and are less used in the high-frequency field, and it is very difficult to achieve low in-band insertion loss and high out-of-band suppression at the same time.

Based on this, the filter provided in the present disclosure combines the inductor with high Q value and the large capacitor with ultra-thin and small-size through the band-pass filter circuit, and effectively realizes the low insertion loss in the passband, the fast attenuation of the band edge, the multi-transmission zero and the good out-of-band suppression characteristics. In addition, the circuit design of the present disclosure can be applied to the field of integrated passive technology, and effectively realize the goal of filter miniaturization and low cost.

An embodiment of the present disclosure provides a filter, as shown in FIG. 1, the filter includes: a first port A, a second port B, a first band-pass filter circuit 10, a second band-pass filter circuit 20 and a third band-pass filter circuit 30. The first band-pass filter circuit 10 is connected with the first port A and is configured to output a first signal after suppressing a signal with a frequency between a first frequency and a second frequency in an initial signal input from the first port A. The second band-pass filter circuit 20 is coupled with the first band-pass filter circuit 10 and is configured to receive the first signal and output a second signal with a frequency between a third frequency and a fourth frequency in the first signal. The third band-pass filter circuit 30 is coupled with the second band-pass filter circuit 20 and is configured to receive the second signal and output a third signal with a frequency between a fifth frequency and a sixth frequency in the second signal to the second port B. The first frequency is less than the second frequency, the third frequency is between the first frequency and the second frequency, and the fifth frequency is between the third frequency and the second frequency.

In an embodiment of the present disclosure, through the mutual cooperation of the first port, the second port, the first band-pass filter circuit, the second band-pass filter circuit and the third band-pass filter circuit, the transmission zero is increased, the effect of out-of-band suppression is improved, and a filter with multiple transmission zeros, large bandwidth, high roll-off characteristics and high out-of-band suppression is constituted.

In an embodiment of the present disclosure, the sixth frequency is greater than the second frequency, and the fourth frequency is greater than the sixth frequency.

For example, the first frequency is 0.8 GHz, the second frequency is 2.7 GHz, the third frequency is 1 GHz, the fourth frequency is 6 GHz, the fifth frequency is 1.6 GHz, and the sixth frequency is 5.2 GHz. Of course, in the specific implementation, the first frequency to the sixth frequency can be determined according to requirements of actual applications, and is not limited here.

Figure 2:
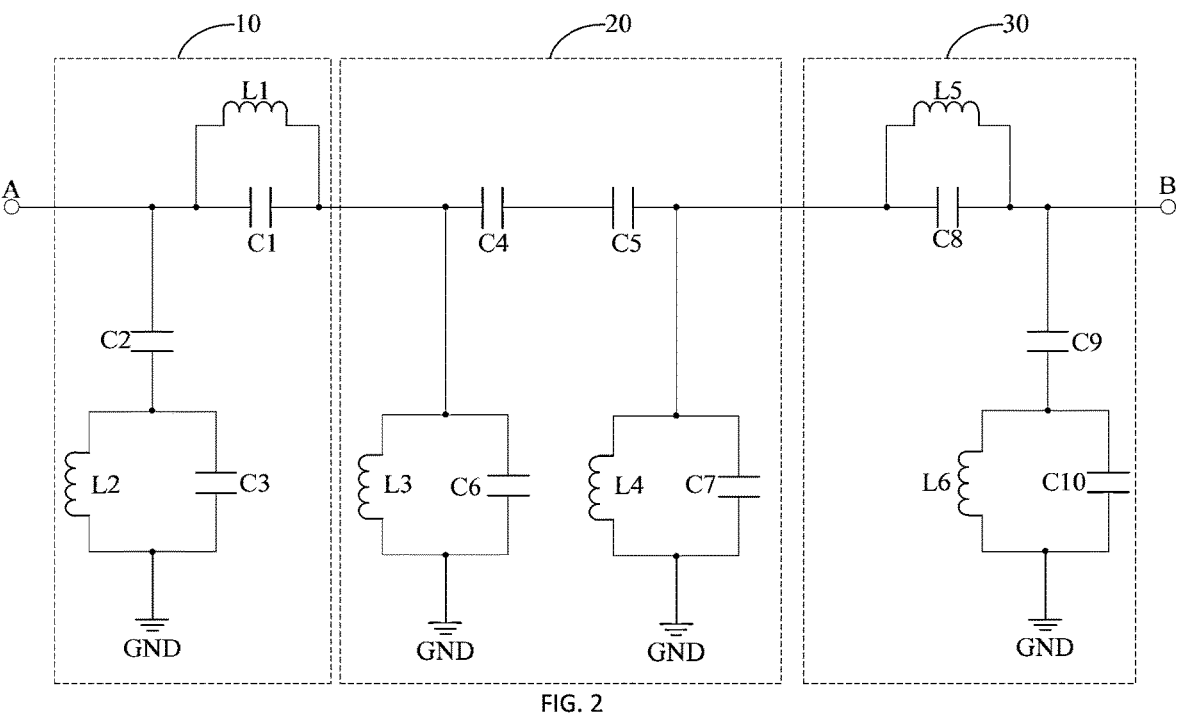
FIG. 2 is a schematic diagram of some other structures of a filter according to an embodiment of the present disclosure.

In an embodiment of the present disclosure, as shown in FIG. 2, the first band-pass filter circuit 10 includes: a first capacitor C1, a second capacitor C2, a third capacitor C3, a first inductor L1, a second inductor L2 and a ground terminal GND. A first electrode of the first capacitor C1 is connected with the first port A, and a second electrode of the first capacitor C1 is connected with the second band-pass filter circuit 20. A first electrode of the first inductor L1 is connected with the first electrode of the first capacitor C1, and a second electrode of the first inductor L1 is connected with the second electrode of the first capacitor C1. A first electrode of the second capacitor C2 is connected with the first electrode of the first capacitor C1, and a second electrode of the second capacitor C2 is connected with a first electrode of the second inductor L2. A second electrode of the second inductor L2 is connected with the ground terminal GND. A first electrode of the third capacitor C3 is connected with the first electrode of the second inductor L2, and a second electrode of the third capacitor C3 is connected with the second electrode of the second inductor L2.

For example, the first capacitor C1 is a strip capacitor.

Through the mutual cooperation of the first capacitor C1, the second capacitor C2, the third capacitor C3, the first inductor L1 and the second inductor L2, the initial signal with the frequency between the first frequency and the second frequency in the initial signal input from the first port A is filtered, the initial signal with the frequency outside the first frequency and the second frequency is reserved, and the reserved initial signal is input into the second band-pass filter circuit 20 as a first signal.

The first band-pass filter circuit 10 mainly plays the role of suppressing low-frequency out-of-band by using relatively few components. Two transmission zeros are formed at low-frequency out-of-band, and positions of the transmission zeros can also be adjusted by finely tuning the inductors and the capacitors, playing a very good role in low-frequency out-of-band suppression.

Figure 3:
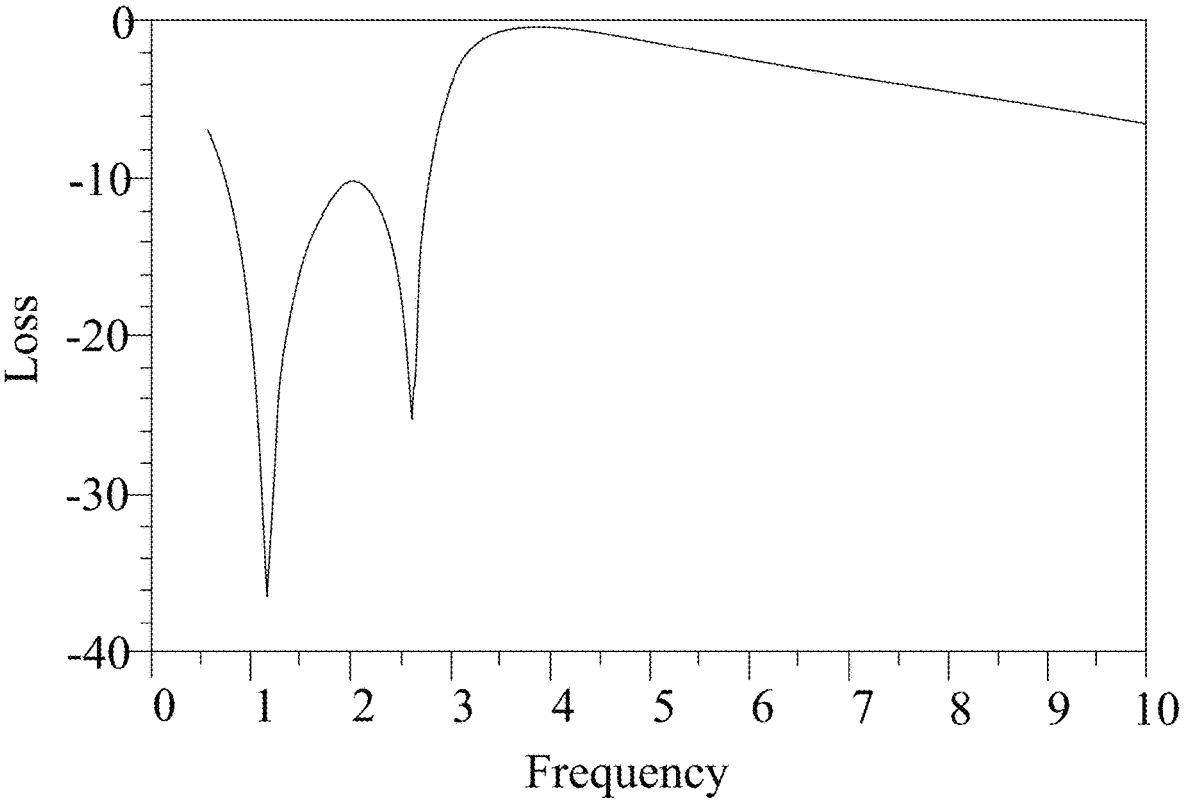
FIG. 3 is a curve diagram according to an embodiment of the present disclosure.

For example, as shown in FIG. 3, the abscissa is the frequency, the ordinate is the loss. As can be seen from FIG. 3, the first band-pass filter circuit 10 can not only generate the passband characteristics at about 3 GHz, but also can generate the transmission zeros at about 1.1 GHz and 2.6 GHz, can well hinder the signal passing near these two frequency points, and play the role of low-frequency out-of-band suppression, but the suppression effect of the circuit structure in the high frequency out-of-band is not good. In addition, it also can be seen from FIG. 3 that the first band-pass filter circuit 10 can generate an additional transmission zero in the low-frequency out-of-band range, and the transmission zero can effectively suppress the transmission loss of the low-frequency part outside the passband and improve the suppression.

Figure 4:
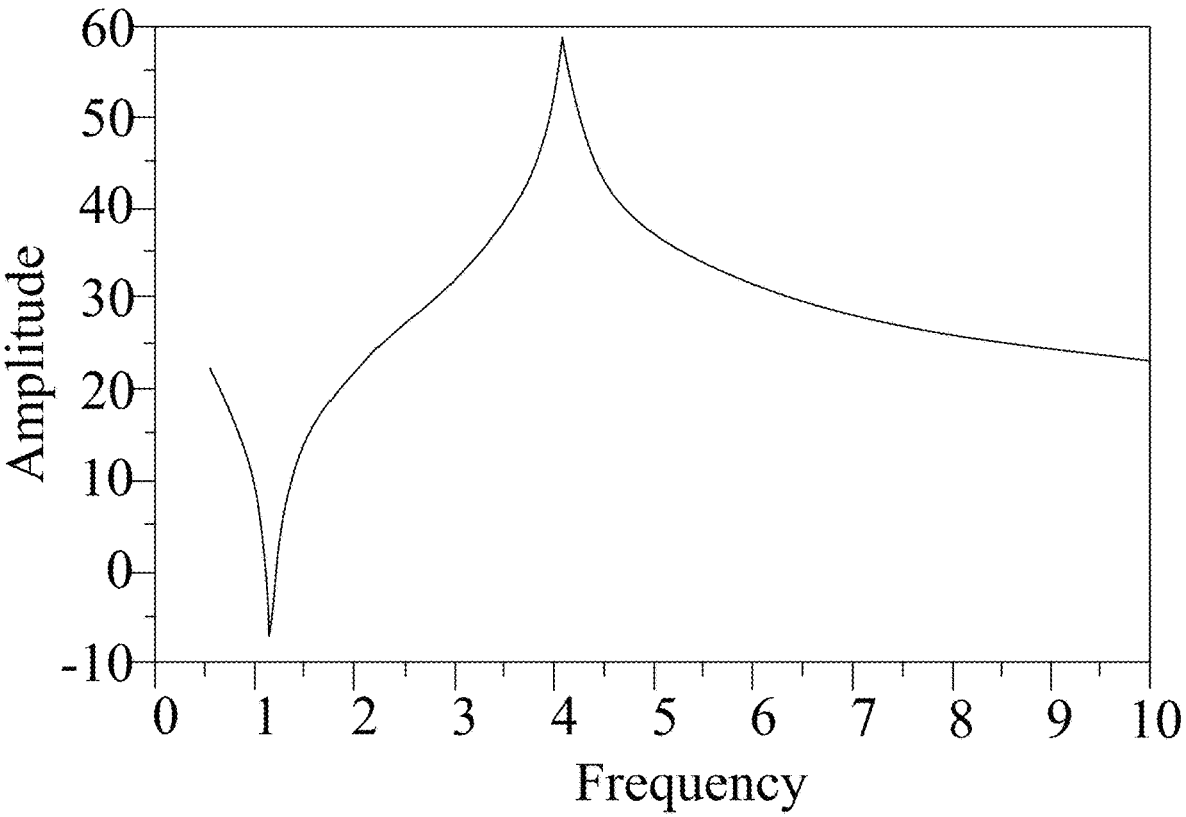
FIG. 4 is another curve diagram according to an embodiment of the present disclosure.

For example, the second capacitor C2, the second inductor L2, and the third capacitor C3 mainly generate the transmission zero at 1.1 GHz, and the impedance curve is shown in FIG. 4, where the abscissa is the frequency and the ordinate is the amplitude.

Figure 5:
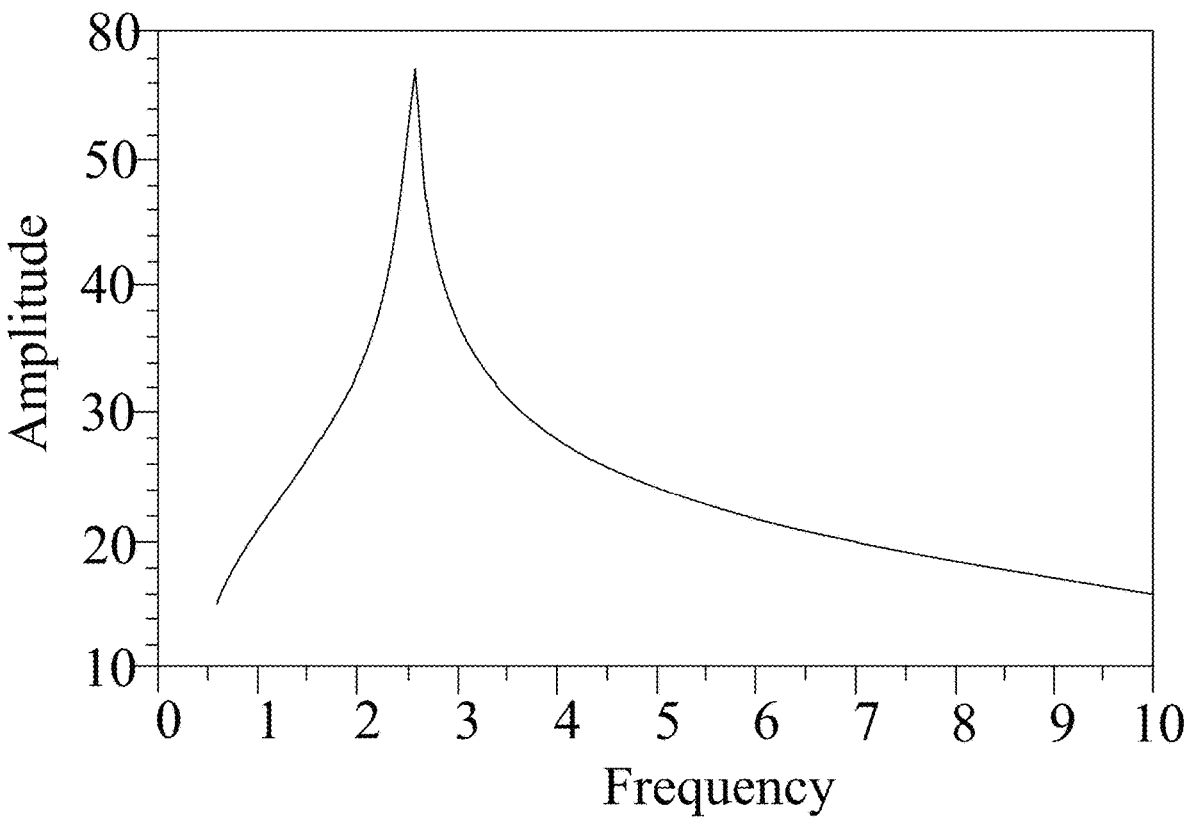
FIG. 5 is another curve diagram according to an embodiment of the present disclosure.

For example, the first capacitor C1 and the first inductor L1 mainly produce a transmission zero at 2.6 GHz, and the impedance curve is shown in FIG. 5, where the abscissa is the frequency and the ordinate is the amplitude.

For example, the inductor in the first band-pass filter circuit 10 can be realized by a 3D wire-wound inductor based on glass, high-impedance silicon, or ceramic, or by a 2D wire-wound inductor formed by a resin material, and is not limited herein.

For example, the capacitor in the first band-pass filter circuit 10 can be realized by an ultra-thin two-layer capacitor structure or by a multi-layer thickened capacitor structure, which is not limited here.

The size of the inductor and capacitor in the first band-pass filter circuit 10 can be designed according to the device size, and the resulting device size can be reduced to the millimeter level, which is much smaller than the common centimeter-level device.

In an embodiment of the present disclosure, as shown in FIG. 2, the second band-pass filter circuit 20 includes: a fourth capacitor C4, a fifth capacitor C5, a sixth capacitor C6, a seventh capacitor C7, a third inductor L3, a fourth inductor L4 and a ground terminal GN. A first electrode of the fourth capacitor C4 is connected with the first band-pass filter circuit 10, a second electrode of the fourth capacitor C4 is connected with a first electrode of the fifth capacitor. A second electrode of the fifth capacitor C5 is connected with the third band-pass filter circuit 30. A first electrode of the sixth capacitor C6 is connected with the first electrode of the fourth capacitor C4, and a second electrode of the sixth capacitor C6 is connected with the ground terminal GND. A first electrode of the third inductor L3 is connected with the first electrode of the sixth capacitor C6, and a second electrode of the third inductor L3 is connected with the second electrode of the sixth capacitor C6. A first electrode of the seventh capacitor C7 is connected with the second electrode of the fifth capacitor C5, and a second electrode of the seventh capacitor C7 is connected with the ground terminal GND. A first electrode of the fourth capacitor L4 is connected with the first electrode of the seventh capacitor C7, and a second electrode of the fourth inductor L4 is connected with the second electrode of the seventh capacitor C7.

The first electrode of the fourth capacitor C4 in the second band-pass filter circuit 20 is connected with the second electrode of the first capacitor C1 in the first band-pass filter circuit 10.

For example, at least one of the fourth capacitor C4 or the fifth capacitor C5 is a strip capacitor.

Through the mutual cooperation of the fourth capacitor C4, the fifth capacitor C5, the sixth capacitor C6, the seventh capacitor C7, the third inductor L3 and the fourth inductor L4, the first signal with a frequency outside the third frequency and the fourth frequency in the first signal input by the first band-pass filter circuit 10 is filtered, the first signal with a frequency between the third frequency and the fourth frequency is reserved, and the reserved first signal is input into the third band-pass filter circuit 30 as a second signal.

For example, the inductor in the second band-pass filter circuit 20 can be realized by a 3D wire-wound inductor based on glass, high-impedance silicon, or ceramic, or by a 2D wire-wound inductor formed by a resin material, and is not limited herein.

For example, the capacitor in the second band-pass filter circuit 20 can be realized by an ultra-thin two-layer capacitor structure, or by a multi-layer thickened capacitor structure, which is not limited here.

The size of the inductor and capacitor in the second band-pass filter circuit 20 can be designed according to the device size, so that the resulting device size can be reduced to the millimeter level, which is much smaller than the common centimeter-level device.

The second band-pass filter circuit 20 mainly plays the role of suppressing low-frequency out-of-band and suppressing high-frequency out-of-band, by using relatively few components. A transmission zero is formed between 0 GHz and 1 GHz of low frequency, a suppression effect for high frequency above 6 GHz is also good, and the position of the transmission zero can also be adjusted by finely tuning the inductors and the capacitors, playing a good role in low-frequency out-of-band suppression. The second band-pass filter circuit 20 can also play the role of impedance matching for connection of the first band-pass filter circuit 10 and the third band-pass filter circuit 30.

Figure 6:
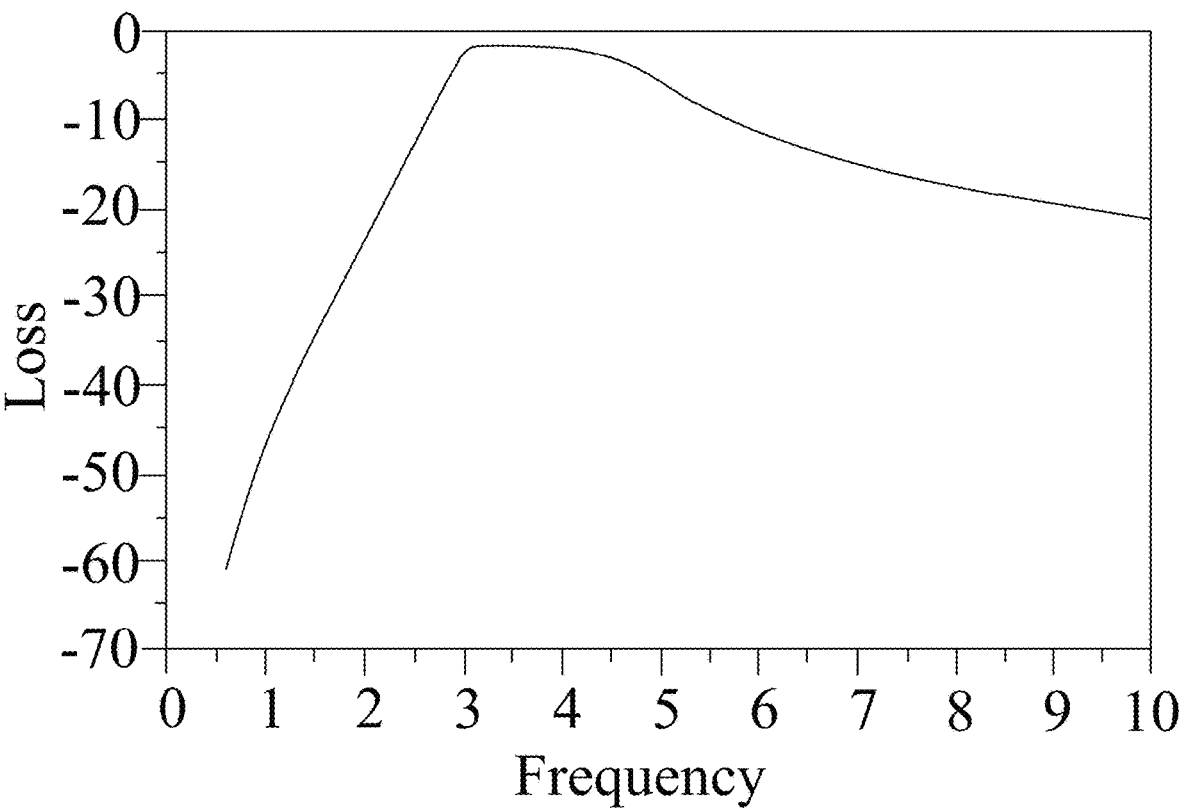
FIG. 6 is another curve diagram according to an embodiment of the present disclosure.

For example, the second band-pass filter circuit 20 is different from the first band-pass filter circuit 10. The second band-pass filter circuit 20 has a certain suppression effect for low-frequency out-of-band and high-frequency out-of-band, and can achieve the impedance matching for the connection of the first band-pass filter circuit 10 and the third band-pass filter circuit 30, and serve as the band-pass filter. As shown in FIG. 6, the abscissa is the frequency and the ordinate is the loss. As can be seen from FIG. 6, the second band-pass filter circuit 20 can generate a transmission zero in the low-frequency range of less than 1 GHz outside the pass-band, and the transmission zero can effectively suppress the transmission loss of the low-frequency part outside the passband and improve the suppression. At the same time, the high-frequency part greater than 6 GHz can be suppressed, but the suppression effect is not obvious.

In an embodiment of the present disclosure, as shown in FIG. 2, the third band-pass filter circuit 30 includes: an eighth capacitor C8, a ninth capacitor C9, a tenth capacitor C10, a fifth inductor L5, a sixth inductor L6 and a ground terminal GND. A first electrode of the eighth capacitor C8 is connected with the second band-pass filter circuit 20, and a second electrode of the eighth capacitor C8 is connected with the second port B. A first electrode of the fifth inductor L5 is connected with the first electrode of the eighth capacitor C8, and a second electrode of the fifth inductor L5 is connected with the second electrode of the eighth capacitor C8. A first electrode of the ninth capacitor C9 is connected with the second electrode of the eighth capacitor C8, and a second electrode of the ninth capacitor C9 is connected with a first electrode of the sixth inductor L6. A second electrode of the sixth inductor L6 is connected with the ground terminal GND. A first electrode of the tenth capacitor C10 is connected with the first electrode of the sixth inductor L6, and a second electrode of the tenth capacitor C10 is connected with the second electrode of the sixth inductor L6.

The first electrode of the eighth capacitor C8 in the third band-pass filter circuit 30 is connected with the second electrode of the fifth capacitor C5 in the second band-pass filter circuit 20.

For example, the eighth capacitor C8 is a strip capacitor.

Through the mutual cooperation of the eighth capacitor C8, the ninth capacitor C9, the tenth capacitor C10, the fifth inductor L5 and the sixth inductor L6, the second signal with a frequency outside the fifth frequency and the sixth frequency in the second signal input by the second band-pass filter circuit 20 is filtered, the second signal with a frequency between the fifth frequency and the sixth frequency is reserved, and the reserved second signal is input into the second port B as a third signal.

For example, a connection wire between a capacitor and a inductor in the filter is a stubby wire.

For example, the inductor in the third band-pass filter circuit 30 can be realized by a 3D wire-wound inductor based on glass, high-impedance silicon, or ceramic, or by a 2D wire-wound inductor formed by a resin material, and is not limited here.

Exemplary, the capacitor in the third band-pass filter circuit 30 can be realized by an ultra-thin two-layer capacitor structure or by a multi-layer thickened capacitor structure, and is not limited here.

The size of the inductor and capacitor in the third band-pass filter circuit 30 can be designed according to the device size, so that the resulting device size can be reduced to the millimeter level, which is much smaller than the common centimeter level device.

The third band-pass filter circuit 30 mainly plays the role of suppressing high and low frequency out-of-band, by using relatively few components. A transmission zero is formed at the out-of-band 5.3 GHz of high frequency, a transmission zero can be formed at the out-of-band 1.6 GHz of low frequency, and the position of the transmission zero can also be adjusted by finely tuning the inductors and the capacitors, playing a good role in high-frequency out-of-band suppression.

Figure 7:
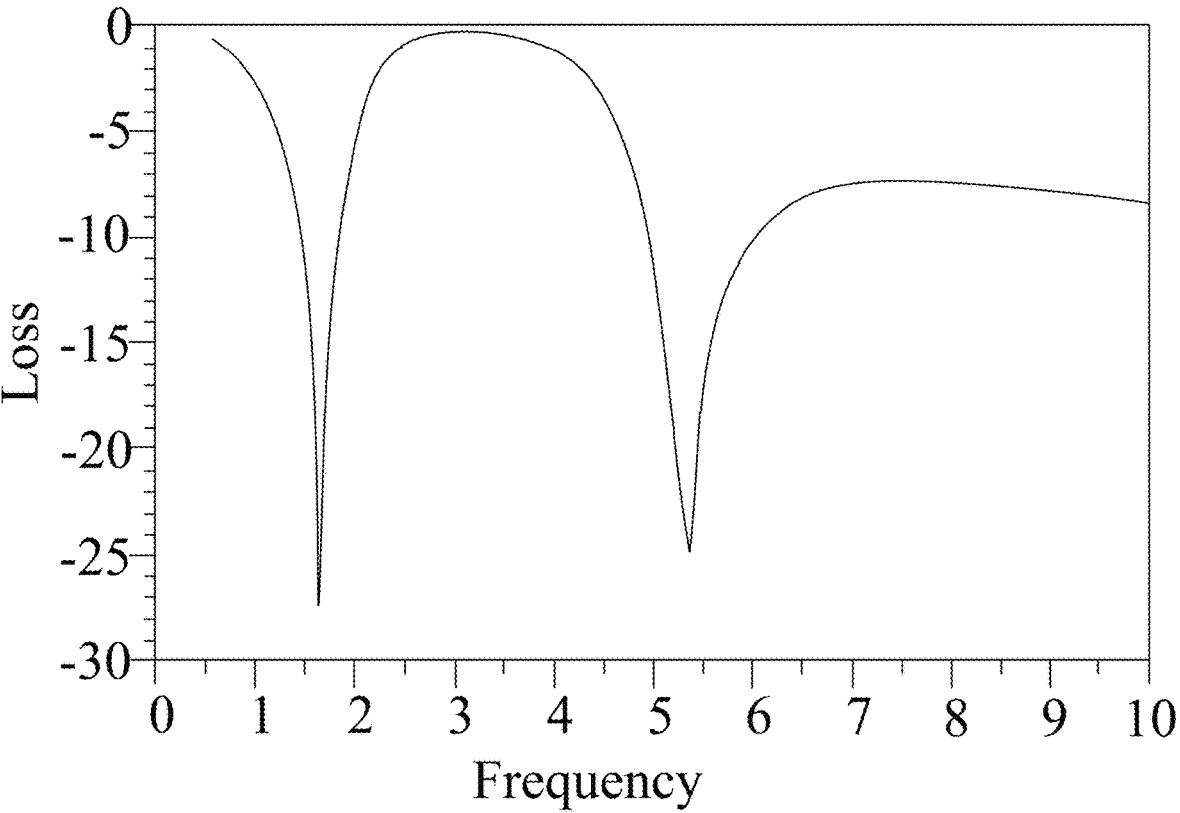
FIG. 7 is another curve diagram according to an embodiment of the present disclosure.

For example, the third band-pass filter circuit 30 plays a different role from that of the first band-pass filter circuit 10 and the second band-pass filter circuit 20. The third band-pass filter circuit 30 mainly suppresses the high-frequency out-of-band, and can generate transmission zeros at 1.6 GHz and 5.2 GHz, can well hinder the signal passing near these two frequency points, and plays the role of high-frequency out-of-band suppression. The third band-pass filter circuit 30 does not have a significant suppression effect on the low-frequency out-of-band, but have a relatively significant suppression effect on the high-frequency out-of-band. As shown in FIG. 7, the abscissa is the frequency and the ordinate is the loss. As can be seen from FIG. 7, the third band-pass filter circuit 30 can generate an additional transmission zero in the high-frequency out-of-band range, and the transmission zero can effectively suppress the transmission loss of the high-frequency part outside the passband and improve the suppression.

Figure 8:
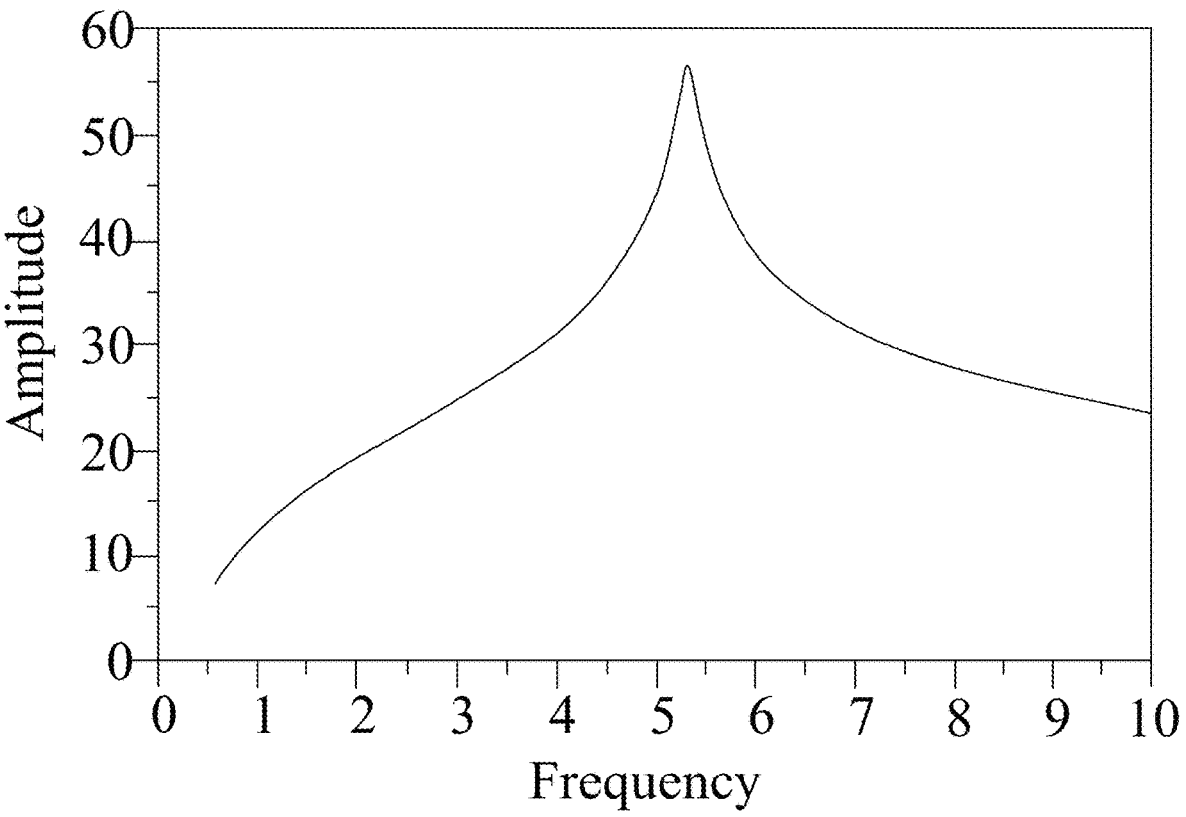
FIG. 8 is another curve diagram according to an embodiment of the present disclosure.

For example, the eighth capacitor C8 and the fifth inductor L5 mainly generate the transmission zero at 5.2 GHz, the impedance curve is shown in FIG. 8, the abscissa is the frequency and the ordinate is the amplitude.

Figure 9:
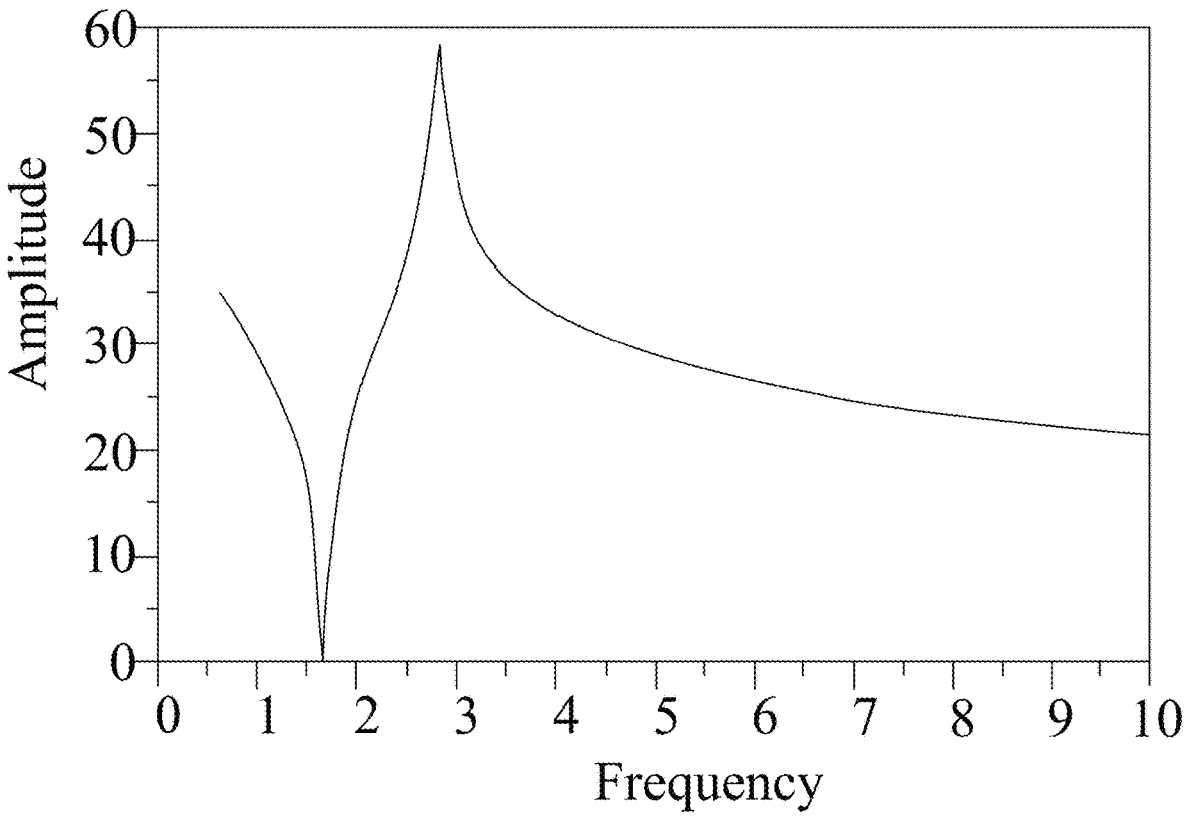
FIG. 9 is another curve diagram according to an embodiment of the present disclosure.

For example, the ninth capacitor C9, the tenth capacitor C10, and the sixth capacitor L6 mainly generate the transmission zero at 1.6 GHz, the impedance curve is shown in FIG. 9, and the abscissa is the frequency and the ordinate is the amplitude.

Figure 10:
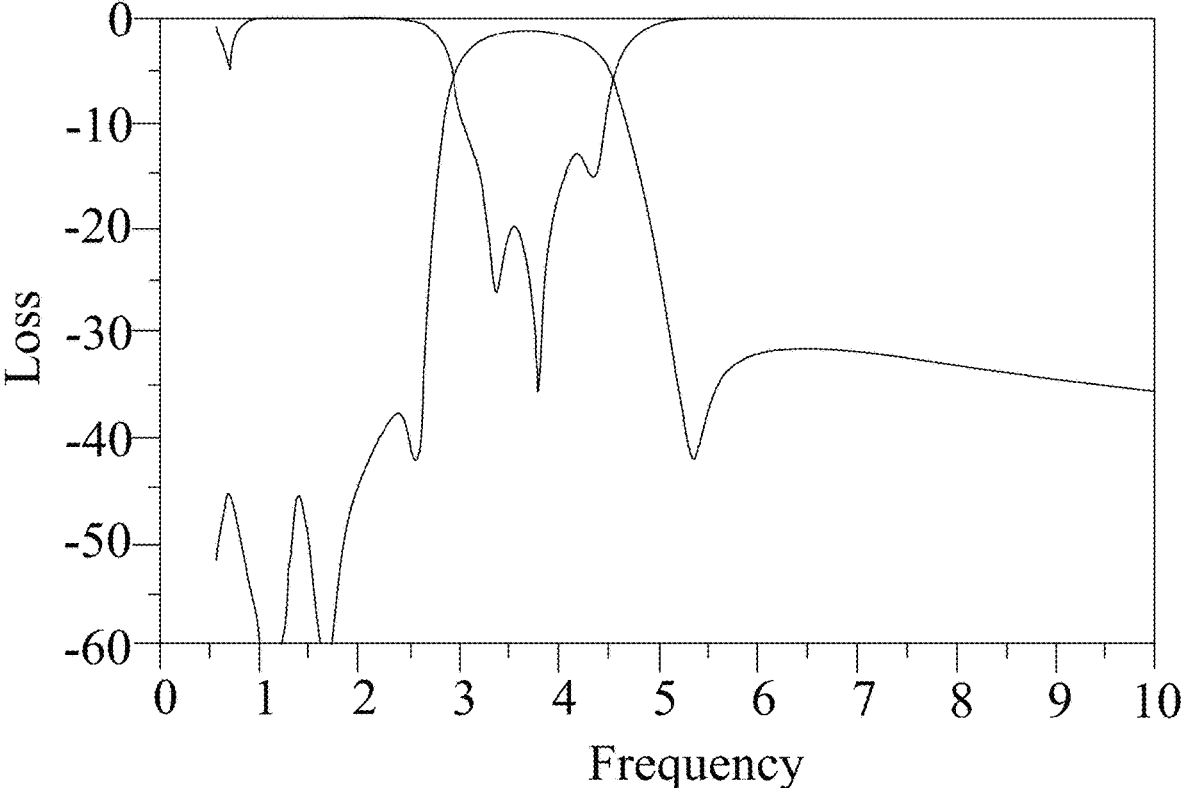
FIG. 10 is another curve diagram according to an embodiment of the present disclosure.

To sum up, each of the first band-pass filter circuit 10, the second band-pass filter circuit 20, and the third band-pass filter circuit 30 can form characteristics of a simple band-pass filter. The first band-pass filter circuit 10 mainly plays the role of suppressing low-frequency out-of-band. The second band-pass filter circuit 20 cannot only suppress the low frequency between 0 GHz and 1 GHz, and but also suppress the high frequency above 6 GHz, and can play the role of connecting the first band-pass filter circuit 10 and the third band-pass filter circuit 30. The third band-pass filter circuit 30 mainly suppresses high-frequency out-of-band. The first band-pass filter circuit 10, the second band-pass filter circuit 20, and the third band-pass filter circuit 30 are combined together to form the final filter, and the filter curve is shown in FIG. 10, where the abscissa is the frequency, and the ordinate is the loss. It can be seen that the filter has a good suppression effect in both low and high frequency out-of-band, and the standing wave in the passband is also relatively good, which is conducive to the tolerance consistency of manufacturing.

For example, capacitor values of the capacitors in the filter provided in the present embodiments may be set to the same. This makes the design easier. Of course, the capacitor values of these capacitors can also be set differently, so that capacitor values can be designed for different capacitors according to their functions.

For example, inductor values of the inductors in the filter provided in embodiments of the present disclosure may be set to the same. This makes the design easier. Of course, the inductor values of these inductors can also be set differently, so that inductor values can be designed for different inductors according to their functions.

For example, the capacitor values of the capacitors in the filter according to embodiments of the present disclosure are in a range of 0.1 to 10 pF.

For example, the inductor values of the inductors in the filter according to embodiments of the present disclosure are in a range of 0.1 to 10 nH.

For example, the filter according to embodiments of the present disclosure is formed on a glass substrate.

Figure 11:
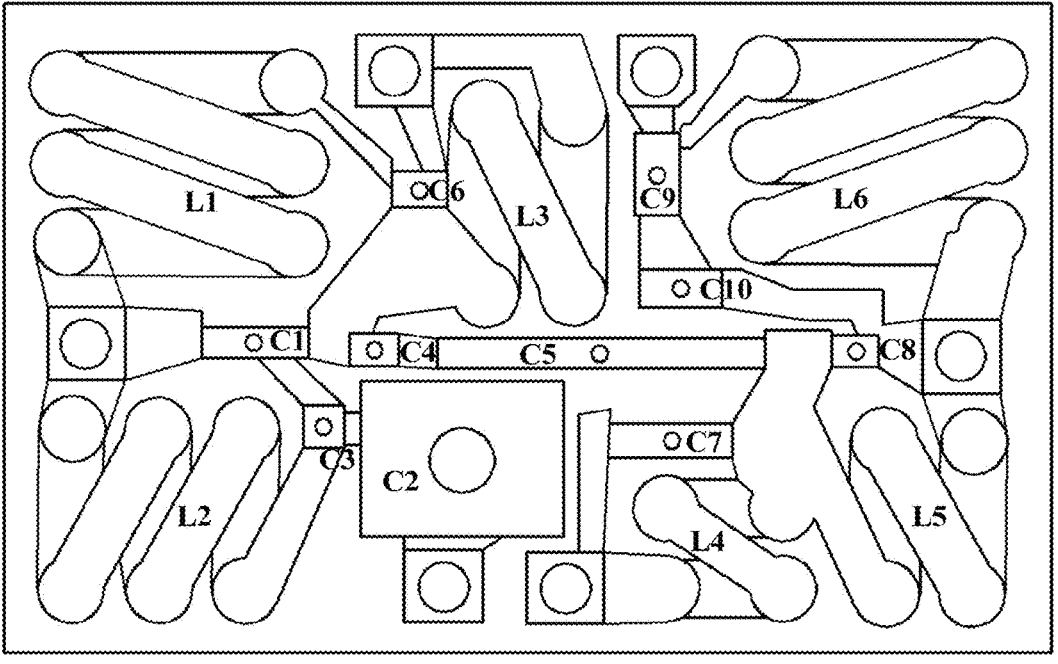
FIG. 11 is a schematic diagram of some other structures of a filter according to an embodiment of the present disclosure.

For example, FIG. 11 is a structural layout of the filter, and it can be seen from FIG. 11 that the first capacitor C1, the fourth capacitor C4, the fifth capacitor C5 and the eighth capacitor C8 constitute the main transmission path of the above-mentioned signal, and the main transmission path is the shortest, so as to ensure that the attenuation of the above-mentioned signal is the smallest, and the loss is optimal. In addition, when selecting the transmission path structure, a large capacitor of the long strip shape was used as the transmission path. This setting has the transmission path, and does not expand the layout space of the capacitor, making the most reasonable use of the layout space.

Moreover, connection wires between the first inductor L1, the second inductor L2, the third inductor L3, the fourth inductor L4, the fifth inductor L5 and the sixth inductor L6 and the first capacitor C1, the second capacitor C2, the third capacitor C3, the fourth capacitor C4, the fifth capacitor C5, the sixth capacitor C6, the seventh capacitor C7, the eighth capacitor C8, the ninth capacitor C9 and the tenth capacitor C10 use stubby wires as much as possible. That is, the stubby connection wires are used between the capacitors and the inductors as much as possible, and a resistance of the connection wire is mainly related to a width and a thickness of the connection wire. The thickness is determined by process parameters and cannot be adjusted in the layout. However, by using a thicker connection wire, the attenuation of the above signal is minimized and the loss is optimized.

In addition, as shown in FIG. 11, the first capacitor C1, the second capacitor C2, the third capacitor C3, the fourth capacitor C4, the fifth capacitor C5, the sixth capacitor C6, the seventh capacitor C7, the eighth capacitor C8, the ninth capacitor C9, and the tenth capacitor C10 all use large-size capacitors as much as possible. Because the capacitor is composed of very thin double-sided electrodes, a dielectric between the electrodes of the capacitor is very thin, which is easy to produce process deviations, and the use of the larger capacitor can effectively reduce the impact of process deviations and improve product consistency. In addition, the current density of the capacitor can be reduced and the carrying power can be increased.

Figure 12:
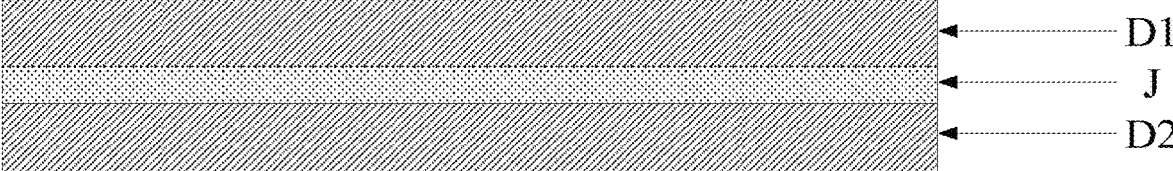
FIG. 12 is a schematic diagram of some other structures of a filter according to an embodiment of the present disclosure.

For example, FIG. 12 shows a cross-sectional diagram of a capacitor described above. As can be seen FIG. 12, the capacitor includes two layers of electrodes (D1 and D2 in FIG. 12) and a dielectric J between the electrodes.

Figure 13:
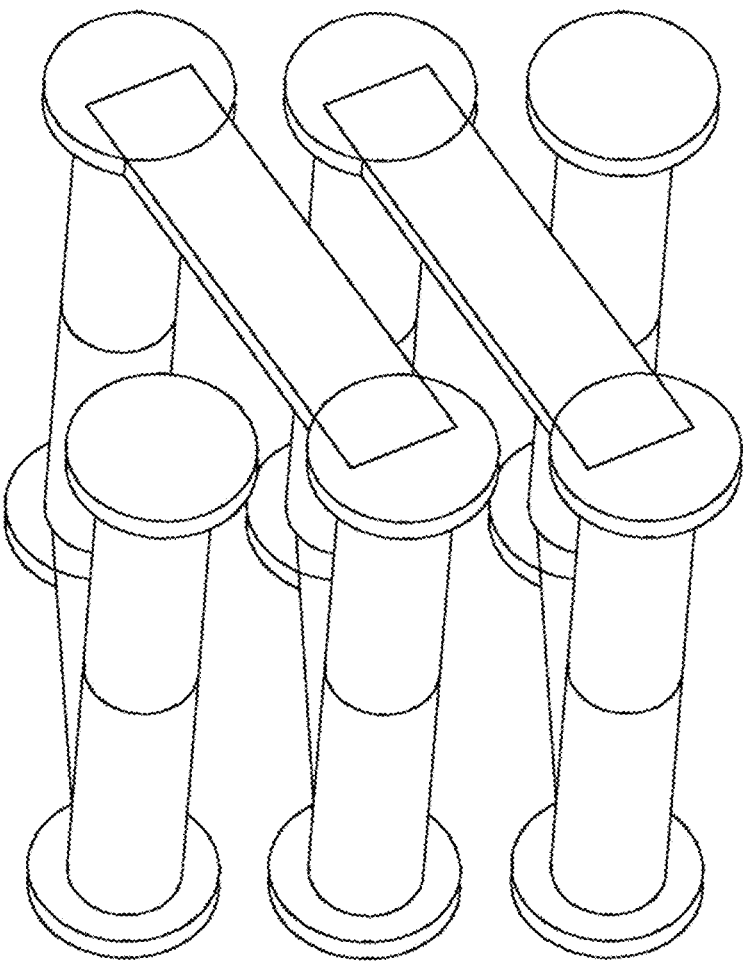
FIG. 13 is a schematic diagram of some other structures of a filter according to an embodiment of the present disclosure.

For example, FIG. 13 shows a structure of an inductor described above. As can be seen from FIG. 13, the inductor is a 3D inductor, in which the inductor is made in glass, and a cylinder in the inductor glass is a metal pillar of the glass TGV. ReDistribution Layer (RDL) routing wires of the inductor are made on upper and lower surfaces of the glass.

For example, the filter includes a plurality of inductors and capacitors. The capacitors are mainly made on the upper surface of the glass, and the capacitors and inductors are connected by the ReDistribution Layer (RDL) routing wires. The filter further includes a plurality of bonding points PADs, which are used to input and output signals in components, and are also used for grounding.

The filter in embodiments of the present disclosure is a high-frequency filter, which is used for eliminating the interference clutter signal, and filtering the input signal or the output signal to obtain a pure high-frequency signal.

Based on the same inventive concept, an embodiment of the present disclosure further provides an integrated passive device, including the filter according to embodiments of the present disclosure. The principle of solving the problem of the integrated passive device is similar to that of the aforementioned filter, so the implementation of the integrated passive device can be referred to the implementation of the aforementioned filter, and will not be repeated here.

Based on the same inventive concept, an embodiment of the present disclosure further provides an electronic device, including the above-mentioned integrated passive device according to embodiments of the present disclosure. The principle of solving the problem of the electronic device is similar to that of the aforementioned integrated passive device, so the implementation of the electronic device can be described in the implementation of the aforementioned integrated passive device, and will not be repeated here.

For example, the electronic device can be a radio frequency device.

Although embodiments of the present disclosure have been described, those embodiments may be subject to additional changes and modifications once the basic inventive concepts are known to those skilled in the art. Therefore, the attached claims are intended to be construed to include embodiments and all changes and modifications that fall within the scope of the present disclosure.

Obviously, the skilled in the art may make various changes and variants to embodiments of the present disclosure without departing from the spirit and scope of embodiments of the present disclosure. Thus, if these modifications and variants of embodiments of the present disclosure fall within the scope of the claims of the present disclosure and their equivalents, the present disclosure is also intended to include these modifications and variants.

What is claimed is:

1. A filter, comprising: a first port, a second port, a first band-pass filter circuit, a second band-pass filter circuit and a third band-pass filter circuit;

wherein the first band-pass filter circuit is connected with the first port and is configured to output a first signal after suppressing a signal with a frequency between a first frequency and a second frequency in an initial signal input from the first port;

the second band-pass filter circuit is coupled with the first band-pass filter circuit, and is configured to receive the first signal, and output a second signal with a frequency between a third frequency and a fourth frequency in the first signal;

the third band-pass filter circuit is coupled with the second band-pass filter circuit, and is configured to receive the second signal, and output a third signal with a frequency between a fifth frequency and a sixth frequency in the second signal to the second port;

wherein the first frequency is less than the second frequency;

the third frequency is between the first frequency and the second frequency;

the fifth frequency is between the third frequency and the second frequency;

wherein the sixth frequency is greater than the second frequency and the fourth frequency is greater than the sixth frequency.

2. The filter of claim 1, wherein the filter is a high-frequency filter.

3. The filter of claim 1, wherein the first band-pass filter circuit comprises: a first capacitor, a second capacitor, a third capacitor, a first inductor, a second inductor and a ground terminal;

a first electrode of the first capacitor is connected with the first port, and a second electrode of the first capacitor is connected with the second band-pass filter circuit;

a first electrode of the first inductor is connected with the first electrode of the first capacitor, and a second electrode of the first inductor is connected with the second electrode of the first capacitor;

a first electrode of the second capacitor is connected with the first electrode of the first capacitor, and a second electrode of the second capacitor is connected with a first electrode of the second inductor;

a second electrode of the second inductor is connected with the ground terminal;

a first electrode of the third capacitor is connected with the first electrode of the second inductor, and a second electrode of the third capacitor is connected with the second electrode of the second inductor.

4. The filter of claim 3, wherein the first capacitor is a strip capacitor.

5. The filter of claim 1, wherein the second band-pass filter circuit comprises: a fourth capacitor, a fifth capacitor, a sixth capacitor, a seventh capacitor, a third inductor, a fourth inductor and a ground terminal;

a first electrode of the fourth capacitor is connected with the first band-pass filter circuit, and a second electrode of the fourth capacitor is connected with a first electrode of the fifth capacitor;

a second electrode of the fifth capacitor is connected with the third band-pass filter circuit;

a first electrode of the sixth capacitor is connected with the first electrode of the fourth capacitor, and a second electrode of the sixth capacitor is connected with the ground terminal;

a first electrode of the third inductor is connected with the first electrode of the sixth capacitor, and a second electrode of the third inductor is connected with the second electrode of the sixth capacitor;

a first electrode of the seventh capacitor is connected with the second electrode of the fifth capacitor, and a second electrode of the seventh capacitor is connected with the ground terminal;

a first electrode of the fourth inductor is connected with the first electrode of the seventh capacitor, and a second electrode of the fourth inductor is connected with the second electrode of the seventh capacitor.

6. The filter of claim 5, wherein at least one of the fourth capacitor or the fifth capacitor is a strip capacitor.

7. The filter of claim 1, wherein the third band-pass filter circuit comprises: an eighth capacitor, a ninth capacitor, a tenth capacitor, a fifth inductor, a sixth inductor and a ground terminal;

a first electrode of the eighth capacitor is connected with the second band-pass filter circuit, and a second electrode of the eighth capacitor is connected with the second port;

a first electrode of the fifth inductor is connected with the first electrode of the eighth capacitor, and a second electrode of the fifth inductor is connected with the second electrode of the eighth capacitor;

a first electrode of the ninth capacitor is connected with the second electrode of the eighth capacitor, and a second electrode of the ninth capacitor is connected with a first electrode of the sixth inductor;

a second electrode of the sixth inductor is connected with the ground terminal;

a first electrode of the tenth capacitor is connected with the first electrode of the sixth inductor, and a second electrode of the tenth capacitor is connected with the second electrode of the sixth inductor.

8. The filter of claim 7, wherein the eighth capacitor is a strip capacitor.

9. The filter of claim 1, wherein a connection wire between a capacitor and an inductor in the filter is a stubby wire.

10. The filter of claim 1, wherein capacitor values of capacitors in the filter are same.

11. The filter of claim 10, wherein the capacitor values of the capacitors in the filter are in a range of 0.1 to 10 pF.

12. The filter of claim 1, wherein inductor values of inductors in the filter are same.

13. The filter of claim 12, wherein the inductor values of the inductors in the filter are in a range of 0.1 to 10 nH.

14. The filter of claim 1, wherein the filter is formed on a glass substrate.

15. An integrated passive device, comprising the filter of claim 1.

16. An electronic device, comprising the integrated passive device of claim 15.

17. A display device, comprising the electronic device of claim 16.

* * * * *